US007002440B2

(12) United States Patent
Attarian et al.

(10) Patent No.: US 7,002,440 B2
(45) Date of Patent: Feb. 21, 2006

(54) COMPACT LOW COST CURRENT SENSOR AND CURRENT TRANSFORMER CORE FOR CIRCUIT BREAKERS HAVING IMPROVED DYNAMIC RANGE

(75) Inventors: Farshid Attarian, Collinsville, CT (US); Alberto Anibal Figueroa, Southington, CT (US); Javier Ignacio Larranaga, Bristol, CT (US); Joseph Criniti, New Britain, CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/004,721

(22) Filed: Dec. 3, 2004

(65) Prior Publication Data

US 2005/0083155 A1  Apr. 21, 2005

Related U.S. Application Data

(62) Division of application No. 09/681,454, filed on Apr. 10, 2001, now Pat. No. 6,844,799.

(51) Int. Cl.
*H01H 75/00* (2006.01)
(52) U.S. Cl. ......................................... 335/18; 336/173
(58) Field of Classification Search ............. 356/84 M, 356/173; 335/18; 324/127
See application file for complete search history.

(56) References Cited

U.S. PATENT DOCUMENTS 3,621,334 A    11/1971  Burns et al.
5,321,378 A *  6/1994  Ferullo et al. .............. 335/202
5,495,169 A    2/1996   Smith
5,892,420 A *  4/1999   Larranaga et al. ............ 335/18
6,018,239 A    1/2000   Berkcan et al.
6,580,347 B1 * 6/2003   Otte et al. .................... 336/83

FOREIGN PATENT DOCUMENTS

JP    56067915 A  *  6/1981
JP   358216412 A  * 12/1983
JP   401300506 A  * 12/1989

OTHER PUBLICATIONS

Abstract of Japan Publication No. 56-067915, Date of publication Aug. 6, 1981 (1 page).
Abstract of Japan Publication No. 01-300506, Date of publication May 12, 1989 (1 page).

* cited by examiner

*Primary Examiner*—Lincoln Donovan
(74) *Attorney, Agent, or Firm*—Cantor Colburn LLP

(57) ABSTRACT

A circuit breaker having a housing, a pair of separable contacts, a current sensor strap in electrical communication with the contacts, an operating mechanism for operating the contacts, an electronic trip unit in operable communication with the sensor strap and the mechanism, and a current transformer is disclosed. The current transformer has a mixed material magnetic core having a first layer of material having a relatively high magnetic permeability, and a second layer of material having a relatively low magnetic permeability abutting the first layer of material. The core has a profile with an opening therethrough for accepting the sensor strap. A signal generator is disposed proximate the core to provide an output signal representative of a magnetic flux associated with the sensor strap. The mixed material magnetic core exhibits a dynamic range greater than a dynamic range of a similar shaped magnetic core having only one material of the first layer of material and the second layer of material.

16 Claims, 9 Drawing Sheets

COMPACT LOW COST CURRENT SENSOR AND CURRENT TRANSFORMER CORE FOR CIRCUIT BREAKERS HAVING IMPROVED DYNAMIC RANGE

CROSS REFERENCE TO RELATED APPLICATIONS

This application is a divisional application of U.S. application Ser. No. 09/681,454 filed 10 Apr. 2001 now U.S. Pat. No. 6,844,799, which is hereby incorporated by reference in its entirety.

BACKGROUND OF THE INVENTION

This invention relates generally to current transformers for providing secondary power and current sensors for monitoring electrical current, and particularly to circuit breakers employing the aforementioned current transformers and current sensors.

Current transformers (CT's) and current sensors are well known in the field of electronic circuit breakers, providing the general function of powering the electronics within the circuit breaker trip unit and sensing the circuit current within the protected circuit. While CT designs vary widely, each must address the requirements of fitting within a given volume of space, such as within a circuit breaker housing, and providing the desired level of accuracy when sensing the circuit current. A predetermined maximum core volume is required within the current transformer to ensure that the current transformer does not become magnetically saturated upon the occurrence of overcurrent conditions when used within compact circuit breakers having variable ampere ratings. Alternatively, a predetermined minimum core volume is required to insure that the core will become sufficiently magnetized at the lower steady-state operating current levels.

To provide a continuous representation of the current level within a protected circuit of an associated electrical distribution system, a current transformer is connected within the circuit breaker as described in U.S. Pat. Nos. 4,591,942 and 5,321,378 (hereinafter the '942 and '378 patents, respectively), both entitled "Current Transformer Assembly". The current transformers as employed therein also derive operating power from the circuit current to power-up the electronic components within the circuit breaker electronic trip unit.

With regard to limiting CT size, a single iron core current transformer has been used to both sense the circuit current along with providing operational power to the electronic trip unit in higher ampere-rated circuit breakers. To prevent the iron cores from becoming saturated at higher current levels, expensive magnetic steel laminates have been used and the core size increased to allow for overload and short circuit current sensing.

In lower ampere-rated circuit breakers employing CT's for both sensing circuit current and powering up the electronic trip unit circuit, the CT size constraints require the use of expensive steel core laminations in order to optimize transformer action with the least possible amount of material and without reaching saturation.

With regard to circuit current sensing, an iron core current transformer for providing trip unit operating power and an air core current transformer for circuit current sensing have been used, as described in U.S. Pat. No. 4,297,741 (hereinafter the '741 patent) entitled "Rate Sensing Instantaneous Trip Mode Network". However, the use of two current transformers in each pole of a circuit breaker is not always feasible because of volumetric constraints. While an improved packaging arrangement of a combination iron and air core current transformer is described in U.S. Pat. No. 5,889,450 (hereinafter the '450 patent) entitled "Current Transformer Assembly for electronic Circuit Interrupters", the resultant specialized winding and assembly techniques result in a higher cost design.

Further with regard to circuit current sensing, a Hall-effect sensor in an air gap of a non-continuous "figure-eight" core, as described in U.S. Pat. No. 5,694,103 (hereinafter the '103 patent) entitled "Laminated FIG. 8 Power Meter Core", has been used. The laminated figure-eight power meter core employed therein provides a ferromagnetic core for use in electric meters for converting an electrical current to a proportional magnetic flux for the detection and measurement with a Hall-effect sensor. While such an arrangement may prove feasible in power meters at lower currents or with a high volume of ferromagnetic core material, such an arrangement is still subject to the saturation considerations described above when high-currents are involved or when volumetric constraints limit the amount of ferromagnetic core material that can be used. Additionally, current sensors and power-up CT's in circuit breakers must typically operate under a broad range of current levels, such as from 0.1X to 1000X, and current sensors and CT's in overload relays must typically operate in the 0.1X–9X current range, whereas current sensors in power meters typically operate under a narrower range of current levels, such as from 0X–2X. Power meters typically require a high degree of rms-current sensing linearity in the 0X–2X range, since it is within this range that metered power usage typically operates. Overload relays typically require a high degree of rms-current sensing linearity in the 0.1X–9X range, since it is within this range that the CT must power up and the current sensor must operate for adequate overload protection. Circuit breakers typically require a high degree of rms-current sensing linearity in the 0.1X–9X range, for similar reasons as those stated for the overload relays, and a high degree of peak-current sensing capability in the 9X–1000X range, since it is within this range that the current sensor must operate for adequate short circuit protection. Root-mean-square (rms) current sensing is well known to one skilled in the art of current sensing, and generally refers to an accurate method for calculating the energy associated with a sinusoidal current wave. Peak-current sensing is also well known to one skilled in the art of current sensing, and generally refers to an accurate method for determining the occurrence of a peak current above a pre-defined threshold. Since different design considerations must be taken into account regarding circuit breaker, overload relay, and power meter applications, a ferromagnetic core that is specifically designed for the sensitivity and linearity characteristics of a power meter may not necessarily have the required sensitivity and linearity characteristics for a circuit breaker or overload relay.

The ferromagnetic cores in the aforementioned '942 and '103 patents employ a stacked-lamination core fabrication technique. An alternative fabrication technique is illustrated in U.S. Pat. No. 5,892,420 (hereinafter the '420 patent) entitled "Electronic Circuit Breaker Having Modular Current Transformer Sensors", which produces a wound-lamination core from a continuous roll of strip metal. While both the stacked-lamination core and wound-lamination core fabrication techniques produce cores with low eddy current losses, the wound-lamination core provides an improved method for arranging separate bobbins on the core. Additionally, the wound-lamination core provides a method of fabricating a core with thinner laminations since the handling of thin laminations in a stacked-lamination core is difficult.

Magnetic cores having power-up and circuit current sensing capability may be employed in conventional circuit breakers, double break rotary circuit breakers, residential circuit breakers, commercial circuit breakers, industrial circuit breakers, air circuit breakers, overload relays, power meters, or any similar device providing electric circuit protection. Applications involving magnetic cores in circuit protective devices include, but are not limited to, the utility, industrial, commercial, residential, and automotive industries.

In view of the foregoing, it would be advantageous to provide a low cost magnetic core having a compact design, power-up capability, accurate circuit current sensing capability, and extended linearity range (dynamic range).

BRIEF DESCRIPTION OF THE INVENTION

Embodiments of the invention include a circuit breaker having a housing, a pair of separable contacts, a current sensor strap in electrical communication with the contacts, an operating mechanism for operating the contacts, an electronic trip unit in operable communication with the sensor strap and the mechanism, and a current transformer. The current transformer has a mixed material magnetic core having a first layer of material having a relatively high magnetic permeability, and a second layer of material having a relatively low magnetic permeability abutting the first layer of material. The core has a profile with an opening therethrough for accepting the sensor strap. A signal generator is disposed proximate the core to provide an output signal representative of a magnetic flux associated with the sensor strap. The mixed material magnetic core exhibits a dynamic range greater than a dynamic range of a similar shaped magnetic core having only one material of the first layer of material and the second layer of material.

Other embodiments of the invention include a circuit breaker having a means for connecting and disconnecting a protected circuit, a current transformer, and a signal generator. The current transformer has a mixed material magnetic core having a first layer of material having a relatively high magnetic permeability, and a second layer of material having a relatively low magnetic permeability abutting the first layer of material. The core has a profile with an opening therethrough for accepting a current conductor. The signal generator is disposed proximate the core to provide an output signal representative of a magnetic flux associated with the current conductor. The mixed material magnetic core exhibits a dynamic range greater than a dynamic range of a similar shaped magnetic core having only one material of the first layer of material and the second layer of material.

BRIEF DESCRIPTION OF THE DRAWINGS

Referring to the exemplary drawings wherein like elements are numbered alike in the accompanying Figures.

DETAILED DESCRIPTION OF THE INVENTION

Figure 1:
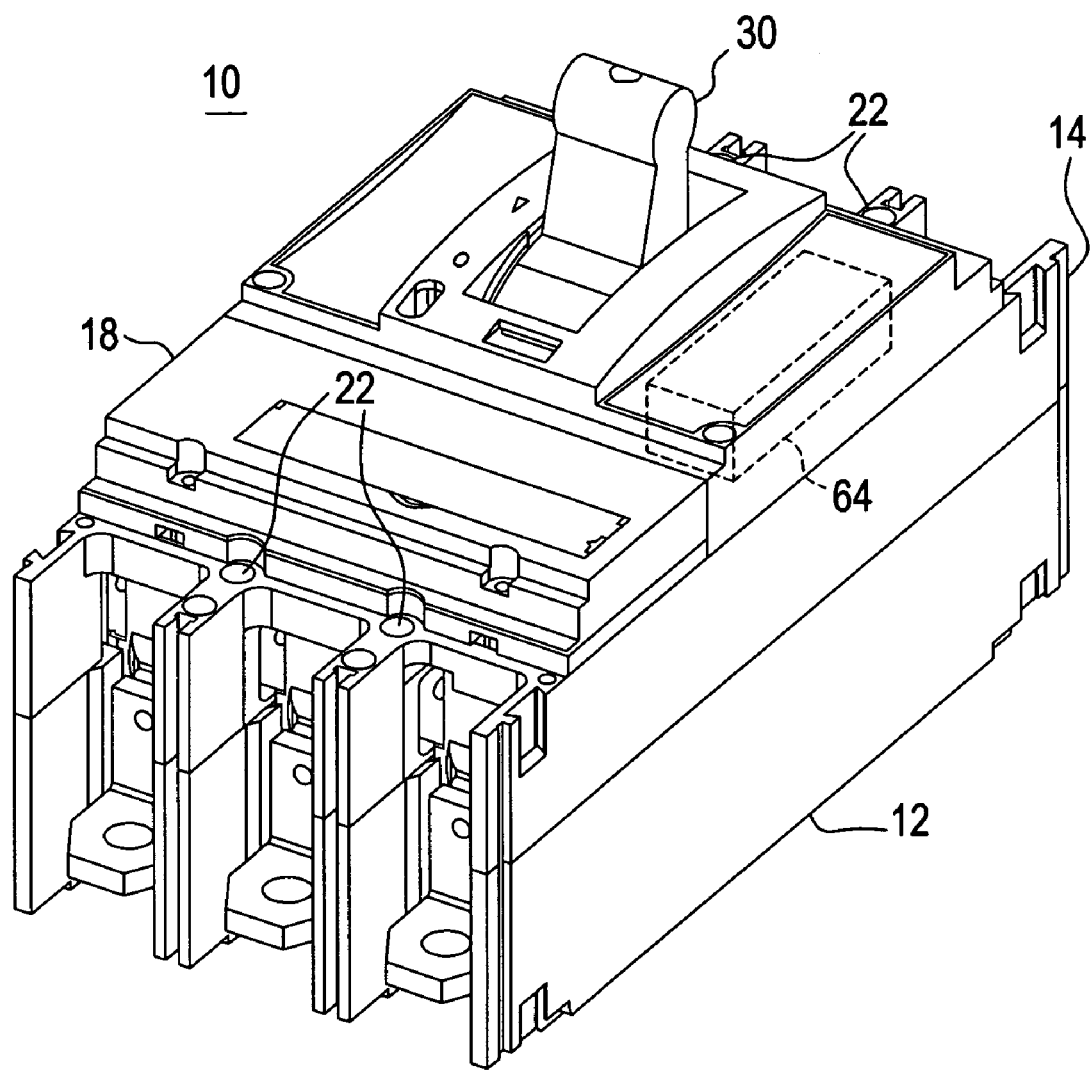
FIG. 1 illustrates a perspective view of an electrical circuit breaker incorporating the present invention.

In an exemplary embodiment, a mixed material magnetic core is provided that enables a compact CT design to function at high current levels without excessive saturation, and to function at low current levels without excessive loss in accuracy but with sufficient magnetization. As hereinafter described, some embodiments of the invention may overcome the problems noted above while offering additional advantages. While reference is occasionally made to only CT's, one skilled in the art will appreciate that current sensors, power meters, audio transformers, high frequency filters, and other electromagnetic devices employing magnetic cores, may all benefit from the advantages offered by the herein described mixed material magnetic core.

In an exemplary embodiment, a C-shaped core is fabricated from two continuous rolls of different magnetic strip metals, wherein each layer of strip metal starts and stops at a pre-defined location to establish an air gap therebetween. The mixture of magnetic strip metals within the core produces a core with uniquely defined magnetic characteristics to provide the above noted advantages. A magnetic flux sensor, such as but not limited to, a Hall-effect sensor, a Giant Magneto Resistive (GMR) device, or a Magneto Resistive (MR) device, is placed within the air gap for sensing the magnetic flux associated with the current in a primary conductor, and thereby providing circuit current sensing since the associated magnetic flux is representative of the circuit current. The C-shaped core may be arcuate (rounded) or squared (box-shaped), but nonetheless is substantially C-shaped with a segmented leg that defines an air gap. The C-shaped core also provides a central opening for a conductor to pass through. The C-shaped core, which substantially surrounds the electrical conductor, serves to concentrate the magnetic flux associated with the conductor, thereby providing a magnetic flux input for a secondary coil or magnetic flux sensor.

Suitable metals for one of the two different magnetic materials include, but are not limited to, Nickel-Iron (NiFe) alloys with greater than (>) 50% Nickel (Ni). More suitable metals for one of the two different magnetic materials include, but are not limited to, NiFe alloys with 80% Ni. Alternatively, suitable metals for one of the two different magnetic materials includes, but are not limited to, cobalt-based (Co-based) amorphous metallic alloys, and cobalt-iron (CoFe) alloys that may also include vanadium (e.g., CoFe—V having 49% Co, 49% Fe, and 2% Vanadium (V)).

Suitable metals for the other of the two different magnetic materials include, but are not limited to, NiFe alloys with less than or equal to (<OR=) 50% Ni. More suitable metals for the other of the two different magnetic materials include, but are not limited to, NiFe alloys with 50% Ni. Alternatively, suitable metals for the other of the two different magnetic materials includes, but are not limited to, iron-based (Fe-based) amorphous metallic alloys, and silicon-iron (SiFe) (alternatively, silicon steel) alloys that typically have less than 5% Si.

NiFe alloys with a relatively high percentage of Ni, versus NiFe alloys with a relatively low percentage of Ni, are more sensitive to low currents that produce low strength magnetic fields, but are more costly and require more NiFe material to avoid saturation at high currents that produce high strength magnetic fields. NiFe alloys with a relatively low percentage of Ni, versus NiFe alloys with a relatively high percentage of Ni, are less costly and require less NiFe material to avoid saturation at high currents that produce high strength magnetic fields, but are less sensitive to low currents that produce low strength magnetic fields. For example, a core of magnetic material that contains a mixture of NiFe alloys with greater than 50% Ni, such as for example 80% Ni (a relatively high percentage of Ni), and NiFe alloys with no greater than (less than or equal to) 50% Ni, such as for example 50% Ni (a relatively low percentage of Ni), is more sensitive to low currents that produce low strength magnetic fields than is a core made completely from NiFe alloys having less than or equal to 50% Ni, and is less costly and requires less material to avoid saturation at high currents that produce high strength magnetic fields than is a core made completely from NiFe alloys having greater than 50% Ni.

In an exemplary embodiment, a circuit breaker or other electrical device may employ the CT or mixed material magnetic core as described herein, thereby enabling the electrical device to operate at high current levels without core saturation, and at low current levels with sufficient core magnetization for sensing magnetic flux or circuit current.

Some embodiments of the mixed material magnetic core may have a magnetization characteristic that results in a lower percentage output error at low current levels (low strength magnetic fields) as compared to a NiFe core with less than or equal to (<or=) 50% Ni, and a greater saturation point at high current levels (high strength magnetic fields) as compared to a NiFe core with greater than (>) 50% Ni. Thus, some embodiments of the mixed material magnetic core may provide a low cost magnetic core, for power up, current sensing, or both, have a compact design, power-up capability, accurate circuit current sensing capability (rms and peak), and extended linearity range.

Circuit Breaker Overview

Figure 2:
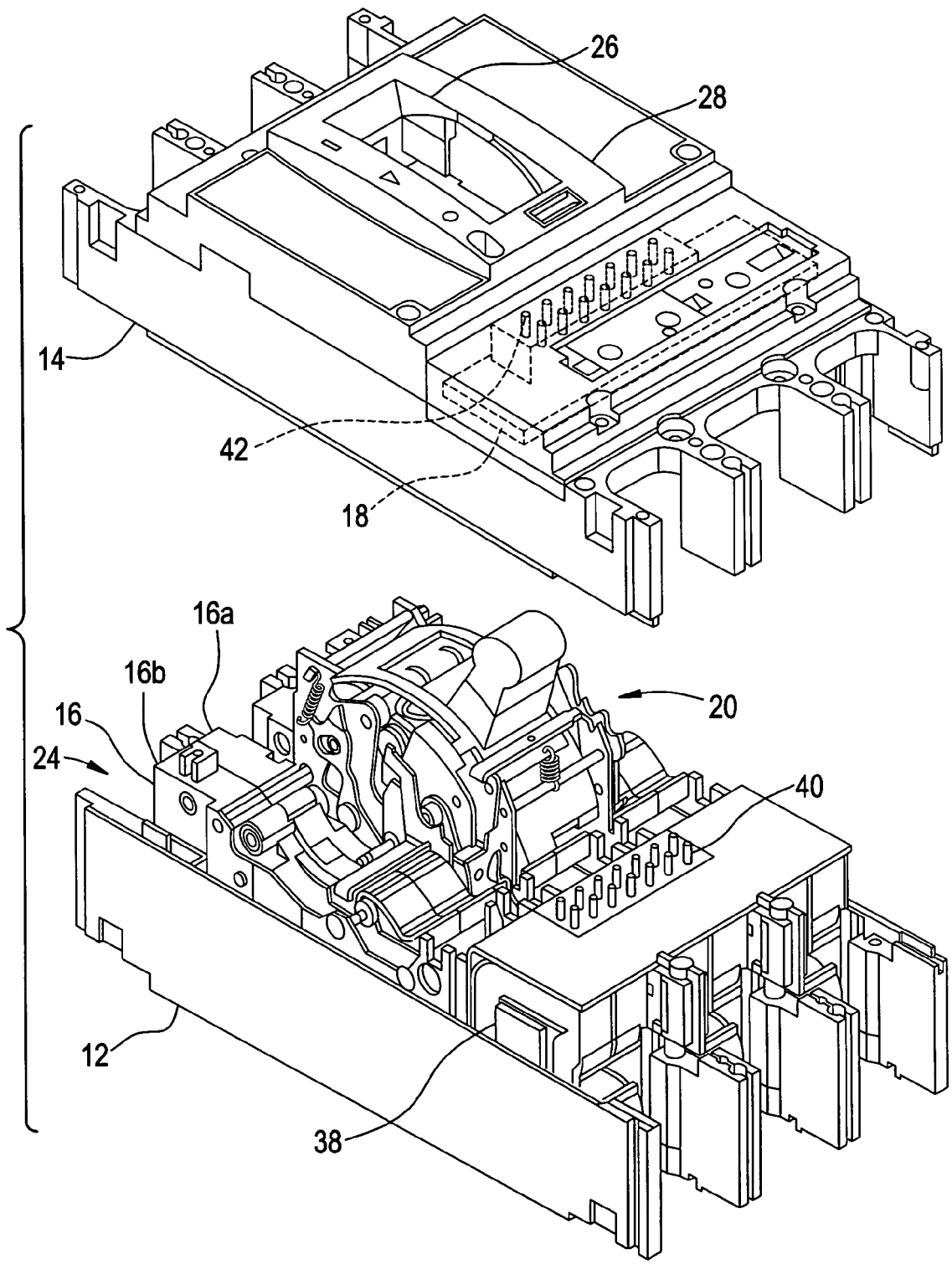
FIG. 2 illustrates a perspective view of the electrical circuit breaker of FIG. 1 with the cover removed.

An exemplary circuit breaker 10 in accordance with embodiments of the invention is depicted in the perspective view of FIG. 1 and the exploded view of FIG. 2. Base 12 and cover 14, defining the circuit breaker housing, captivate cassette 16, trip unit 18 and operating mechanism 20 by fasteners, not shown, through holes 22. Cassette halves 16a,b are secured by fasteners, not shown, and are positionally located in pocket 24 of base 12.

For simplicity and clarity, where more than one element of the same type is present, only one will be referenced, but one skilled in the art will readily recognize that the single reference pertains to more than one element of the same type. Here, for example, there are three cassettes 16 and three pockets 24. Each cassette 16 is positionally located in an associated pocket 24. Reference is made to a cassette 16 and a pocket 24, but one skilled in the art will readily recognize that three cassettes 16 and three pockets 24 are present. Also for simplicity and clarity, reference will only be made to a three phase circuit breaker, but one skilled in the art will recognize that the present invention is equally applicable to single phase, two phase or multi-phase electrical switching devices of any kind.

Figure 3:
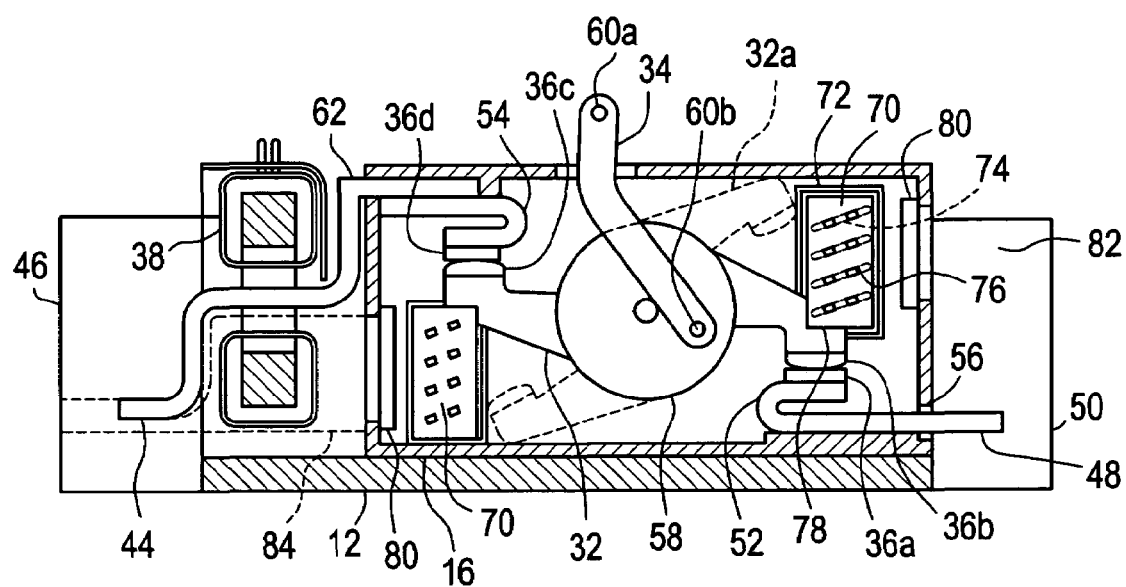
FIG. 3 illustrates a cutaway side view of the electrical circuit breaker of FIG. 1 showing internal electrical components.

Extending through opening 26 of escutcheon 28 on cover 14 is operating handle 30, which is operatively connected to movable contact arm 32 by operating mechanism 20 and link 34, best seen by referring to FIG. 3. Handle 30 enables the opening and closing of electrical contacts 36a,b,c,d.

Operating mechanism 20 is of a type well known to one skilled in the art. An example of such an operating mechanism is depicted generally in FIG. 1, is fully described in commonly assigned U.S. patent application Ser. No. 09/196,706 entitled "Circuit Breaker Mechanism for a Rotary Contact System" filed Nov. 20, 1998, and functions generally to open and close electrical contacts 36a,b,c,d by actuation of operating handle 30.

Referring to FIG. 3, which depicts a cutaway side view of cassette 16 and current sensor 38 in base 12, electrical connections between the protected circuit, not shown, and circuit breaker 10 are made through load terminal 44 on load side 46 of circuit breaker 10. Electrical connections between the power source, not shown, and circuit breaker 10 are made through line terminal 48 on line side 50 of circuit breaker 10.

Trip unit 18 is operatively connected between current sensors 38 by pins 40 and sockets 42, and operating mechanism 20 by actuator 64, shown in phantom in FIG. 1, to effectuate the opening of contacts 36a,b,c,d upon the occurrence of an abnormal overcurrent condition.

Trip unit 18 is of a type well known to one skilled in the art. An example of such a trip unit is depicted generally in FIGS. 1 and 2, is fully described in commonly assigned U.S. Pat. Nos. 4,589,052, 4,728,914, and 4,833,563, and functions generally to initiate a trip action within the actuator 64 after receiving a trip signal from current sensors 38.

An example of an actuator 64 is shown generally in phantom in FIG. 1, is fully described in commonly assigned U.S. patent application Ser. No. 09/518,899 entitled "Fast Acting High Force Trip Actuator" filed Mar. 6, 2000, and functions generally to transfer the trip action to the operating mechanism 20 after receiving a trip signal from the trip unit 18.

Current sensor and current transformer 38 is shown generally in FIGS. 1 and 3, functions generally to power up trip unit 18 and provide trip unit 18 with a signal representative of the circuit current in the protected circuit, and is described in more detail below.

Referring to FIGS. 1, 2 and 3, circuit breaker 10 includes operating handle 30 for driving operating mechanism 20 to manually open and close electrical contacts 36a,b,c,d. Contact 36a is carried by elongated fixed contact arm 52, contacts 36b,c are carried by elongated movable contact arm 32, and contact 36d is carried by elongated fixed contact arm 54. FIG. 3 also shows movable contact arm 32a, depicted in phantom, following an opening action by trip unit 18 and operating mechanism 20. Fixed contact arm 52 extends through opening 56 of cassette 16 to terminate in line terminal 48, which is accessible through an opening, shown generally at pocket 24, in line side 50 of base 12. Obviously, each phase of the multi-phase circuit breaker would have separate conductors per phase, not shown. Operating mechanism 20 is operatively connected to contact arm 32 by link 34, rotor 58, and connecting pins 60a,b.

The current path through circuit breaker 10 in the closed position is best seen by referring to FIG. 3. Under quiescent operating conditions, the current from the power source enters circuit breaker 10 through line terminal 48 (and other line terminals on adjacent phases not shown), and exits through load terminal 44 (and other load terminals on adjacent phases not shown). Between line terminal 48, and load terminal 44, the current path consists of; fixed contact arm 52, electrical contacts 36a and b, movable contact arm 32, electrical contacts 36c and d, fixed contact arm 54, and conductor, or sensor strap, 62. Sensor strap 62 passes through and provides primary current signal to current sensor 38, which is operatively connected to trip unit 18 by pins 40 and sockets 42. Fixed contact arm 54 is mechanically and electrically connected to sensor strap 62 by a fastener, not shown. Sensor strap 62 passes through current sensor 38 to terminate in load terminal 44, which is accessible through an opening, not shown, in load side 46 of base 12.

Arc chute, or arc extinguishing assembly, 70 is removably captivated within cassette 16 by molded detail 72 that is integral to cassette 16. Arc plates 74, are typically, but not necessarily, arranged substantially parallel to one another, have tabs 76 that are captivated in corresponding slots in plate supports 78. Exhaust baffle 80 is removably captivated within cassette 16 by molded slot, not shown, that is integral to cassette 16. Holes, not shown, in exhaust baffle 80 provide for the passage of arc effluent generated from a short circuit interruption condition. The arc effluent passing through exhaust baffle 80 on line side 50 of circuit breaker 10 will exit base 12 through terminal chamber 82. The arc effluent passing through exhaust baffle 80 on load side 46 of circuit breaker 10 will exit base 12 through vent channel 84, shown in phantom in FIG. 3.

Vent channels 84 are shown generally in phantom in FIG. 3, are fully described in commonly assigned U.S. patent application Ser. No. 09/366,473 entitled "Bottom Vented Circuit Breaker Capable of Top Down Assembly Onto Equipment" filed Aug. 3, 1999, and function generally to provide a passage for the arc effluent to travel from the inside of cassette 16 to the outside of circuit breaker 10 during an abnormal overcurrent condition.

Current Sensor and Current Transformer

Figure 4:
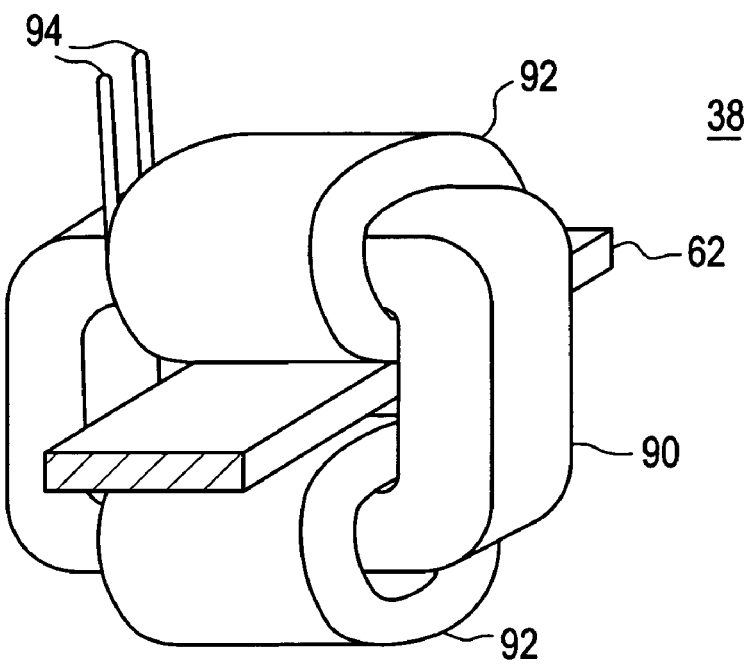
FIG. 4 illustrates a current sensor and current transformer incorporating the present invention.

Referring now to FIG. 4, current sensor and current transformer 38 includes a magnetic core 90 for concentrating the magnetic flux associated with sensor strap 62 (primary winding), one or more secondary windings 92 arranged on bobbins, omitted for clarity, about magnetic core 90 and coupled to each other such that their output signals are additive, and output leads 94 for connecting to pins 40 and providing a signal from secondary windings 92 to trip unit 18. Secondary windings 92 are arranged about portions of magnetic core 90 that are sized to accept the generally cylindrical length of the respective secondary winding 92 and associated bobbin. Such core portions, being generally elongated, are generally referred to as legs, even when the core 90 is generally O-shaped. While only a portion of sensor strap 62 is depicted in FIG. 4 for clarity, one skilled in the art will appreciate that the sensor strap 62 in FIG. 4 is representative of the sensor strap 62 in FIG. 3. The construction of core 90 of FIG. 4 is best seen by now referring to FIGS. 7A and B.

Figure 7A:
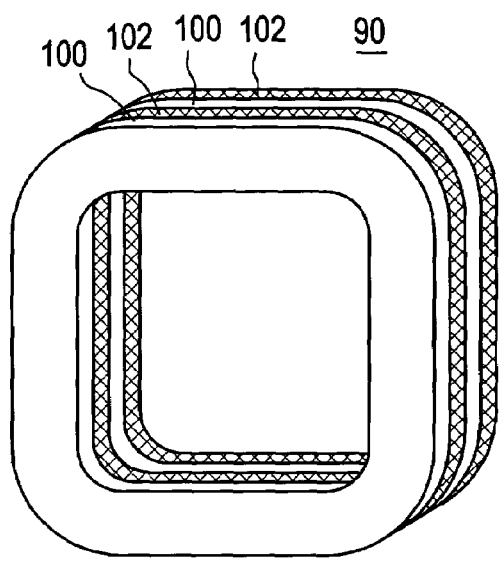
FIGS. 7A, B, C, D, E, F illustrate mixed material magnetic cores incorporating the present invention.

FIG. 7A shows core 90 in a stacked-lamination arrangement in the shape of a letter O, where the laminations are created by stamping, or by any other suitable forming operation, a profile (an outer perimeter defined generally by a width and length) from a magnetic sheet or strip material having a thickness and then stacking them together in alternating layers, or in juxtaposed relationship with respect to each other, such that a first lamination, or layer of material, abuts a second lamination, or layer of material, resulting in a face-to-face, or juxtaposed, stack of laminations that are substantially aligned to define the shape of a letter O. The laminations are then coupled together by conventional means, such as for example; rivets, interlocking projections, straps, or molded bobbin. The O-shaped core 90 may be arcuate or squared, but nonetheless is substantially O-shaped. The term substantially O-shaped is intended to include not only a purely circular arrangement, but also those shapes that approximate a circular arrangement and exhibit similar current sensing characteristics despite their variance in shape, such as, for example, an elliptical-shaped or box-shaped arrangement.

Figure 7B:
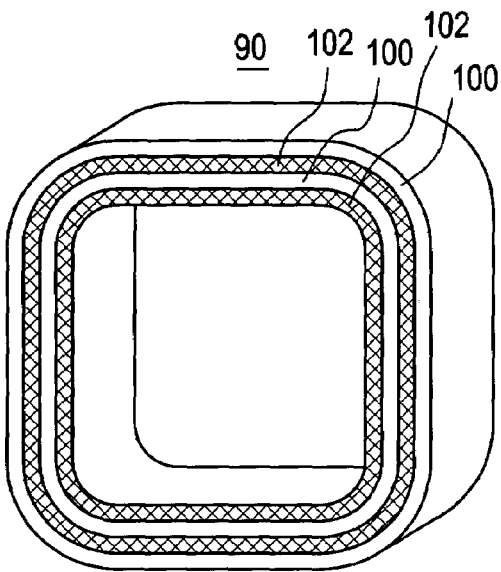

FIG. 7B shows core 90 in a wound-lamination arrangement in the shape of a letter O, where the laminations are created by winding a predefined width and thickness of strip or coil material between predefined start and stop positions in a repetitive manner in order to create a concentric layered arrangement, such that a first lamination, or layer, abuts a second lamination, or layer, resulting in a face-to-face coil of laminations that are substantially aligned to define the shape of a letter O.

While only four laminations are shown for each core 90 in FIGS. 7A and B, one skilled in the art will appreciate that the number of laminations is generally a design choice determined by performance and available space and not limited to the count of four.

FIGS. 7A and B show magnetic core 90 having at least two magnetic materials 100 and 102, thereby creating a mixed material magnetic core. First magnetic material 100 is preferably formed of a magnetic material having a relatively high magnetic permeability so as to provide a core with a low magnetic reluctance. An example of such a material having a relatively high magnetic permeability is the various NiFe alloys with greater than about 50% Ni. More preferably, first magnetic material 100 is formed from a NiFe alloy having about 80% Ni. Alternatively, first magnetic material 100 may be formed from a cobalt-based (Co-based) amorphous metallic alloy, or a cobalt-iron (CoFe) alloy that may also include vanadium (e.g., CoFe—V having 49% Co, 49% Fe, and 2% Vanadium (V)).

Amorphous metallic alloys are produced by rapid solidification of molten metal and exhibit excellent magnetic properties as described in the article entitled "Amorphous Metallic Alloys" in the undated publication entitled "AMOS® Amorphous Cores" by AMOTECH (Advanced Material On TECHnology).

Second magnetic material 102 is preferably formed of a magnetic material having a relatively lower magnetic permeability so as to provide a core with a higher magnetic saturation point and a relatively low magnetic permeability. An example of such a material having a high magnetic saturation point and relatively low magnetic permeability is the various NiFe alloys with no greater than (less than or equal to) about 50% Ni. More preferably, second magnetic material 102 is formed from a NiFe alloy having 50% Ni. Alternatively, second magnetic material 102 may be formed from an iron-based (Fe-based) amorphous metallic alloy, or a silicon-iron (SiFe) (alternatively, silicon steel) alloy that typically have less than 5% Si.

A first magnetic material 100 formed from a NiFe alloy having 80% Ni and a second magnetic material 102 formed from a NiFe alloy having 50% Ni are both available in competitively priced quantities, and thus are preferable over an alternative magnetic material formed from a NiFe alloy having 65% Ni (average of 50% Ni and 80% Ni), which is not available in competitively priced quantities.

Figure 8:
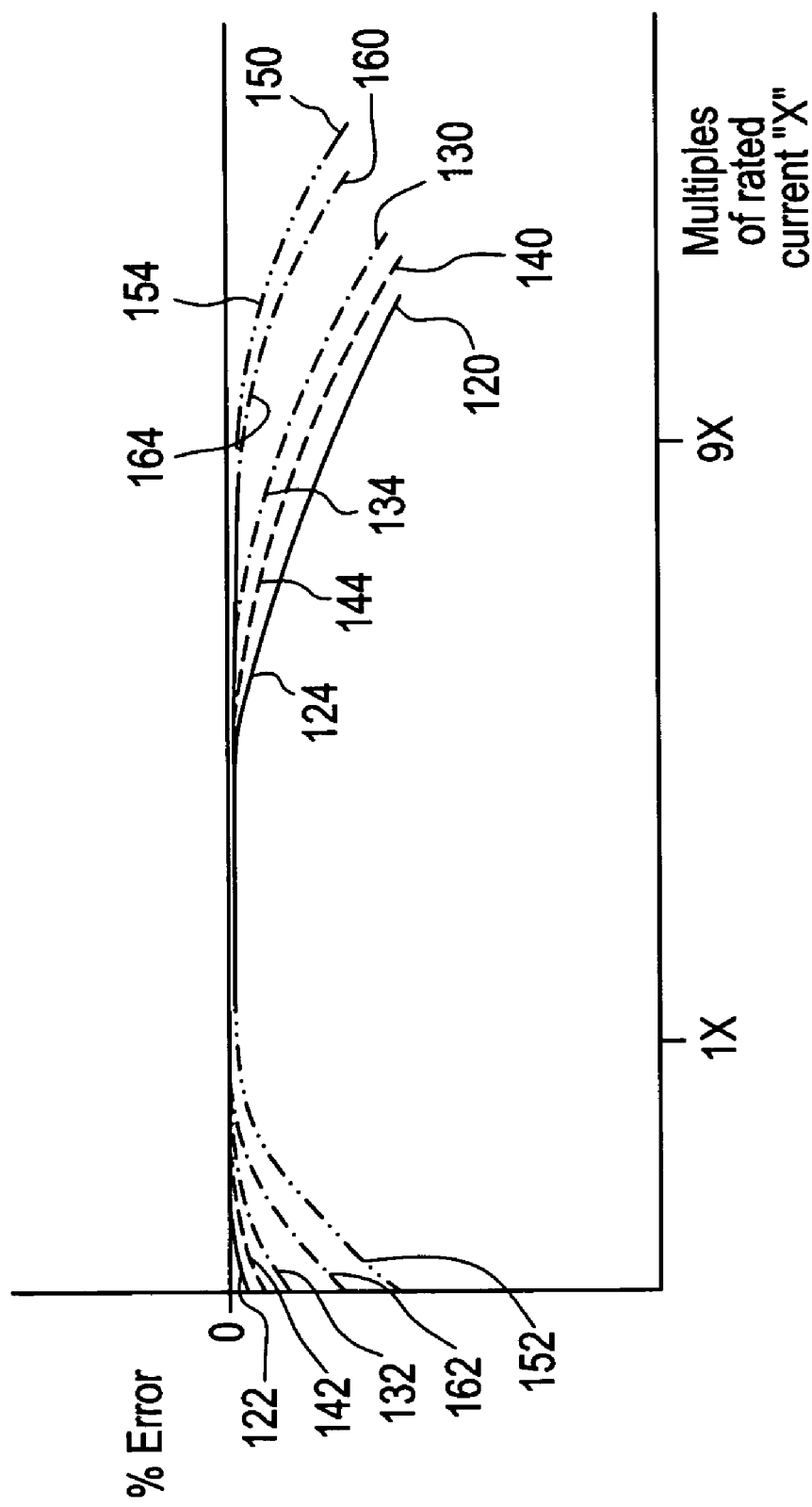
FIG. 8 is a graphical representation of performance characteristics of various magnetic cores relative to circuit current level and to material composition.

An alternating circuit current in sensor strap 62 generates an associated magnetic flux that is concentrated in magnetic core 90. Secondary windings 92 respond to the magnetic flux in core 90 to produce a signal at output leads 94 that is representative of the circuit current in sensor strap 62 and provides operating power to trip unit 18. Magnetic core 90 with mixed magnetic material 100 and 102 results in a magnetic core with a greater dynamic range (linearity and accuracy) than a core not having mixed magnetic material, as shown in FIG. 8. The relative magnetic permeabilities between first and second magnetic materials 100, 102, may be achieved, for example, by first magnetic material 100 having about 10% more Ni than second magnetic material 102, preferably about 20% more Ni than the second magnetic material, and most preferably about 30% more Ni than the second magnetic material.

Referring now to FIG. 8, the dynamic range of a magnetic core 90 is illustrated by showing how the percent error of the output signal at output leads 94 varies as a function of the multiple of rated current in sensor strap 62. Rated current (maximum quiescent operating current) is typically referred to as "1X", thereby resulting in a 1X rated device that may be operated over a range of X-ratings. For example, if the "1X" current rating of the device was 100 amps and the operating range was from 0.2X to 10X, then the current range of the device would be from 20 amps to 1,000 amps. The dynamic range is also an indication of how accurately the concentrated magnetic flux in magnetic core 90 represents the current level (rms or peak) of the current in sensor strap 62 over a range of X-ratings. A magnetic core for a current sensor and current transformer must be capable of operating at fractional and multiple current ratings since the core must be capable of powering up the electronics in trip unit 18 at a fraction of 1X, and must be capable of accurately determining the circuit current in sensor strap 62 at levels in excess of 1X.

Solid line 120 represents the response of a core having a magnetic material formed from a NiFe alloy having about 80% Ni. Dot-dash line 130 represents the response of a core having a magnetic material formed from a NiFe alloy having about 50% Ni. Dashed line 140 represents the response of a mixed material core having a first magnetic material formed from a NiFe alloy having about 80% Ni and a second magnetic material formed from a NiFe alloy having about 50% Ni. Dot-dot-dash line 150 represents the response of a core having a magnetic material formed from a SiFe alloy having about 2.5% Si. Dash-dash-dot line 160 represents the response of a core having a first magnetic material formed from a SiFe alloy having about 2.5% Si and a second magnetic material formed from a NiFe alloy having about 50% Ni.

FIG. 8 shows the percent error within a given core to typically increase negatively at both low multiples (typically less than 1X) and high multiples (typically greater than 2X) of rated current. The region where there is a marked change in percent error from a generally linear to a generally non-linear characteristic is typically referred to as the saturation point, shown generally in FIG. 8 at 124, 134, 144, 154 and 164. Alternatively, by reference to material magnetization curves, or B-H curves, the saturation point of a magnetic material is that region on the B-H curve where dB/dH (first derivative of flux density B with respect to field intensity H) is markedly reduced as H increases.

As shown in FIG. 8 for low multiples of rated current, an 80% Ni core, as shown by characteristic 122 of solid line 120, has less percent error than a (50% /80%) Ni mixed material core, as shown by characteristic 142 of dashed line 140, which has less percent error than a 50% Ni core, as shown by characteristic 132 of dot-dash line 130. Also shown in FIG. 8, but for high multiples of rated current, an 80% Ni core, as shown by characteristic 124 of solid line 120, has a lower saturation point than a (50% /80%) Ni mixed material core, as shown by characteristic 144 of dashed line 140, which has a lower saturation point than a 50% Ni core, as shown by characteristic 134 of dot-dash line 130. Thus, FIG. 8 illustrates the advantages of a (50% /80%) Ni mixed material core, which includes greater accuracy than a 50% Ni core at low multiples of rated current, and a higher saturation point than an 80% Ni core at high multiples of rated current, thereby providing a magnetic core with an overall greater dynamic range than a non-mixed material magnetic core.

With regard to dot-dash line 130 (NiFe alloy with about 50% Ni), dot-dot-dash line 150 (SiFe alloy with about 2.5% Si) and dash-dash-dot line 160 (mixed material of SiFe alloy with about 2.5% Si and NiFe alloy with about 50% Ni), FIG. 8 shows dash-dash-dot line 160 (mixed material SiFe and NiFe) to be between both line 130 (about 50% Ni) and line 150 (about 2.5% Si) for both low and high multiples of rated current, thereby illustrating an expanded dynamic range of a SiFe—NiFe mixed material core where both the materials have a relatively low permeability when taken separately, but where one material has a relatively lower permeability with respect to the other.

From the foregoing, one skilled in the art will recognize that the performance of a particular magnetic core can be established by selectively mixing magnetic materials having relatively different permeabilities.

The accuracy of a mixed material core incorporating the present invention and with regard to rms (root mean square) current is from about 98.7% to about 100% when the current level is at about 0.2X, from about 99.7% to about 100% when the current level is at about 1X, and greater than about 94% when the current level is at about 9X. The accuracy of a mixed material core incorporating the present invention and with regard to peak current is from about 90% to about 100% when the current level is at about 1000X. The experimental data depicted in FIG. 8 was generated using a mixed material core having a first magnetic material formed from a NiFe alloy having about 80% Ni, a second magnetic material formed from a NiFe alloy having about 50% Ni, a mean path length of about 7-inches, a cross-sectional area of about 0.3-inches-squared, and a primary current having an X-rating of about 600-amps rms at 60-hertz.

Alternative Materials with Relative Magnetic Permeabilities

The above-described magnetic materials are described as having relatively high and relatively low magnetic permeabilities. While the combination of magnetic materials having relatively high and relatively low magnetic permeabilities are within the scope of the present invention, the invention is in no way limited to just the above described combination of materials. Rather, the combination of two magnetic materials having magnetic permeabilities not greater than that of a NiFe alloy having 50% Ni is also within the scope of the present invention. Examples of two such materials are, but are not limited to, NiFe alloys having less than or equal to 50% Ni, and Silicon-Iron (SiFe) alloys. Thus, the scope of the invention relates generally to the relative permeability between the materials and not the absolute permeability of either material within the mixed material core.

The magnetic permeability mhu (u) of a material is defined generally as the ratio of flux density (B) to field intensity (H). From the resulting equation of (B)=(u)×(H), a material with a high magnetic permeability will be able to support a higher flux density for a given field intensity than will a material with a low magnetic permeability. Since a NiFe alloy having about 50% Ni has a higher permeability than does a SiFe alloy having about 2.5% Si, the combination of the two materials in a mixed material magnetic core will benefit from the teaching of the present invention and result in an expansion of the dynamic range of the core as compared to a core with only SiFe.

First Alternative Embodiment of Current Sensor and Current Transformer

Figure 5:
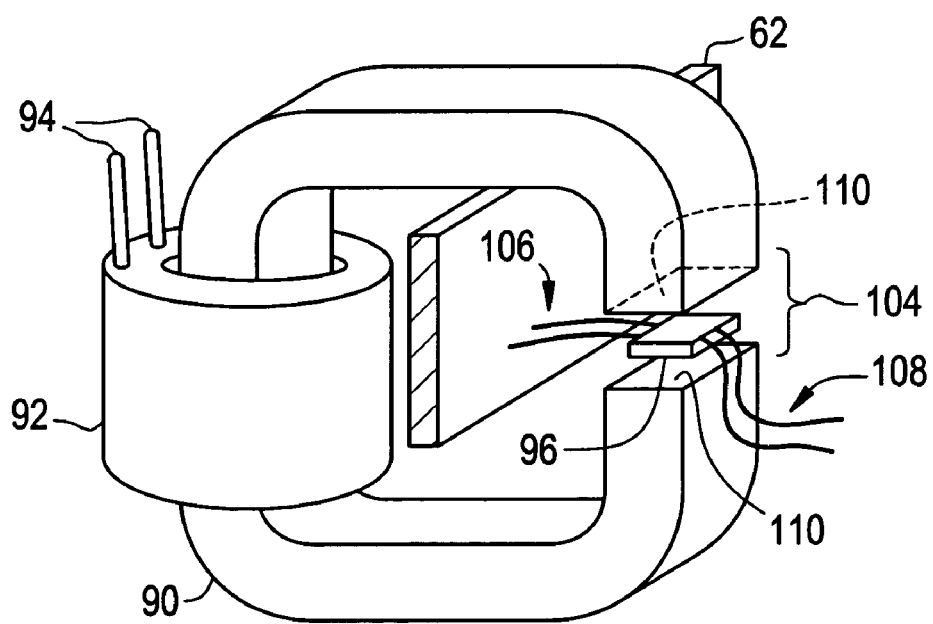
FIG. 5 illustrates an alternative embodiment of a current sensor and current transformer incorporating the present invention.

Referring to FIG. 5, current sensor and current transformer 38 includes a magnetic core 90 for concentrating the magnetic flux associated with sensor strap 62 (primary winding), one or more secondary windings 92 arranged on bobbins, omitted for clarity, about magnetic core 90 and coupled to each other such that their output signals are additive, output leads 94 for connecting to pins 40 and providing a signal from secondary windings 92 to trip unit 18, and magnetic flux sensor 96 with leads 106, 108 for providing an output signal representative of the magnetic flux in core 90 and the circuit current in sensor strap 62. While only a portion of sensor strap 62 is depicted in FIG. 5 for clarity, one skilled in the art will appreciate that the sensor strap 62 in FIG. 5 is representative of the sensor strap 62 in FIG. 3. The construction of core 90 of FIG. 5 is best seen by now referring to FIGS. 7C and D.

Figure 7C:
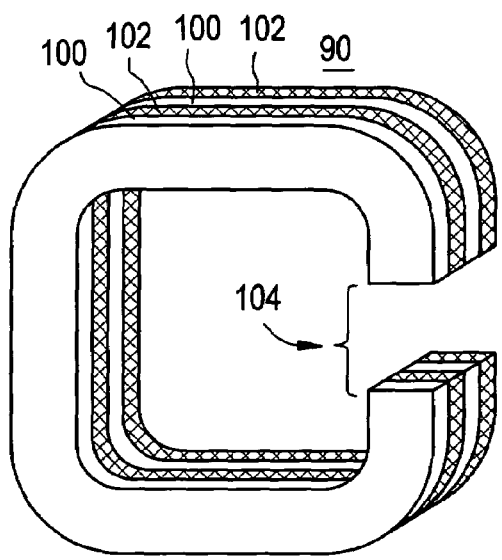

FIG. 7C shows core 90 in a stacked-lamination arrangement in the shape of a letter C, where the laminations are created by stamping, or by any other suitable forming operation, a predefined profile (width and length) from a magnetic sheet or strip material of predefined thickness and then stacking them together in juxtaposed relationship with respect to each other, such that a first lamination, or layer of material, abuts a second lamination, or layer of material, resulting in a face-to-face, or juxtaposed, stack of laminations that are substantially aligned to define the shape of a letter C. The C-shaped core may be arcuate or squared, but nonetheless is substantially C-shaped.

Figure 7D:
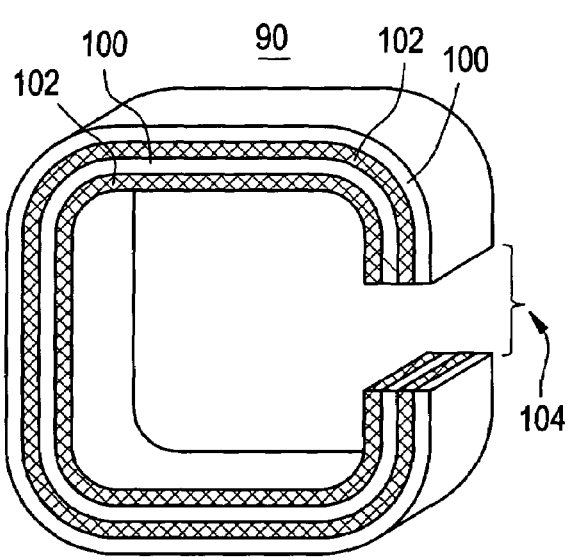

FIG. 7D shows core 90 in a wound-lamination arrangement in the shape of a letter C, where the laminations are created by winding a predefined width and thickness of strip or coil material between predefined start and stop positions in a repetitive manner in order to create a layered arrangement, such that a first lamination, or layer, abuts a second lamination, or layer, resulting in a face-to-face coil of laminations that are substantially aligned to define the shape of a letter C. An air gap 104 defines the space between the predefined start and stop positions, gap faces 110 (shown in FIG. 5 for clarity), of the first and second lamination materials. While only four laminations are shown for each core 90 in FIGS. 7C and D, one skilled in the art will appreciate that the number of laminations is generally a design choice determined by performance and available space and not limited to the count of four.

FIGS. 7C and D show magnetic core 90 having at least two magnetic materials 100 and 102, which are fully described above in reference to FIGS. 7A and B. The aforementioned descriptions for first and second materials 100 and 102 are fully applicable to core 90 of FIGS. 7C and D.

An alternating circuit current in sensor strap 62 generates an associated magnetic flux that is concentrated in magnetic core 90. Secondary windings 92 respond to the magnetic flux in core 90 to produce a signal at output leads 94 that provides operating power to trip unit 18. Magnetic flux sensor 96 located in air gap 104 of core 90 provides an output signal on output voltage leads 108 that is representative of the concentrated magnetic flux in core 90 and the circuit current in sensor strap 62. Leads 106 of magnetic flux sensor 96 connect to a bias voltage source. Magnetic core 90 with mixed magnetic material 100 and 102 results in a magnetic core with a greater dynamic range (linearity and accuracy) than a core not having mixed magnetic material, as shown in FIG. 8 and fully discussed above.

Second Alternative Embodiment of Current Sensor and Current Transformer

Figure 6:
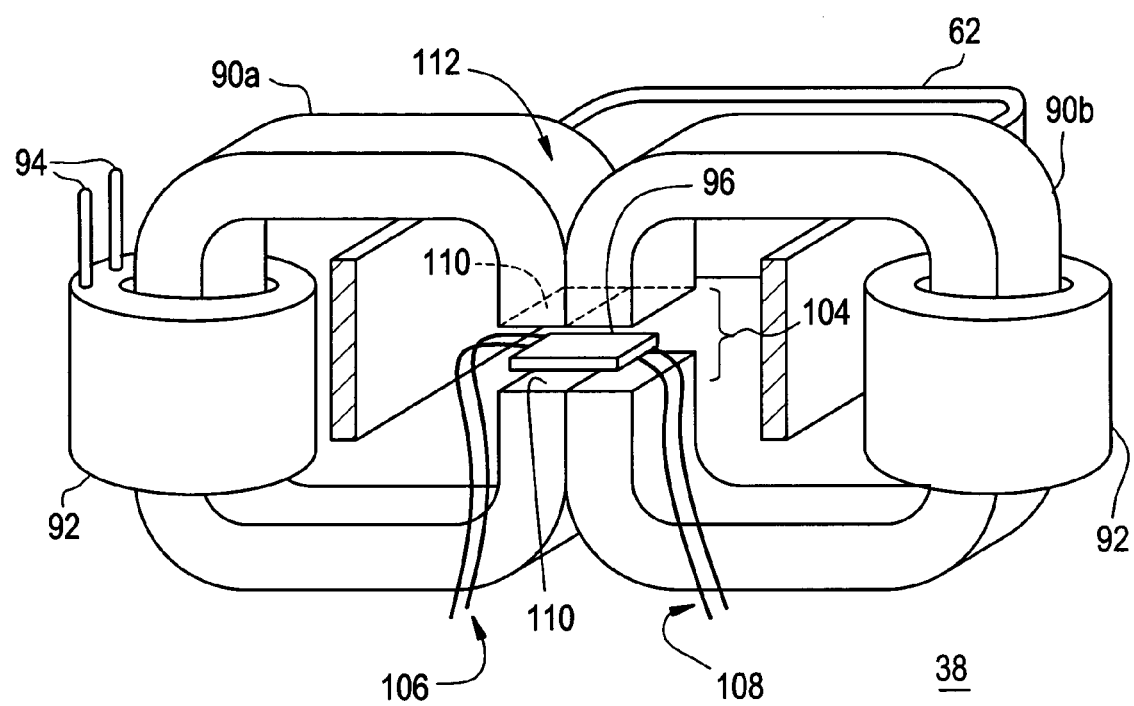
FIG. 6 illustrates another alternative embodiment of a current sensor and current transformer incorporating the present invention.

Referring to FIG. 6, current sensor and current transformer 38 includes a magnetic core 90a,b (hereinafter collectively referred to as magnetic core 90), in the shape of a Figure 8, for concentrating the magnetic flux associated with sensor strap 62 (primary winding), one or more secondary windings 92 arranged on bobbins, omitted for clarity, about magnetic core 90 and coupled to each other such that their output signals are additive, output leads 94 for connecting to pins 40 and providing a signal from secondary windings 92 to trip unit 18, and magnetic flux sensor 96 with leads 106, 108 for providing an output signal representative of the magnetic flux in core 90 and the circuit current in sensor strap 62. The FIG. 8 shape of magnetic core 90 comprises two lobes (represented by core 90a and core 90b), each formed substantially in the shape of a letter C, through which sensor strap 62 passes. Each C-shaped core provides a magnetic circuit (represented by core 90a and core 90b) for concentrating the magnetic flux of the associated leg of sensor strap 62 and provides a portion of a common an air gap 104 in the central leg 112 of the FIG. 8. Each air gap is substantially aligned to define a common air gap between spaced-opposed gap faces 110 in the central leg 112. While only a portion of sensor strap 62 is depicted in FIG. 6 for clarity, one skilled in the art will appreciate that the sensor strap 62 in FIG. 6 is representative of the sensor strap 62 in FIG. 3. The construction of core 90 of FIG. 6 is best seen by now referring to FIGS. 7 E and F.

Figure 7E:
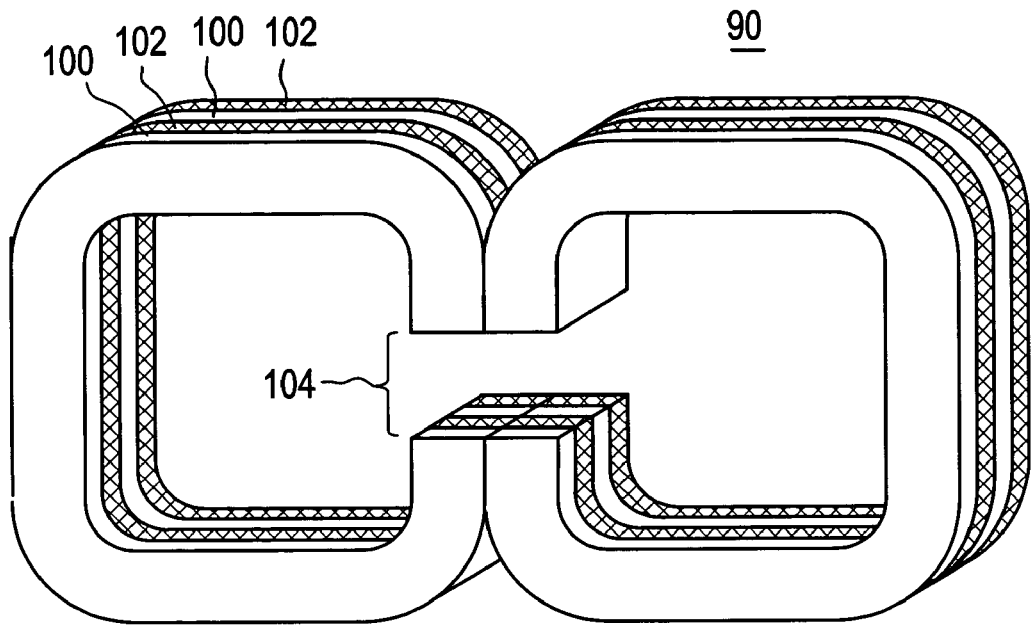

FIG. 7E shows core 90 in a stacked-lamination arrangement, where the laminations are created by stamping, or by any other suitable forming operation, a predefined profile (width and length) from a magnetic sheet or strip material of predefined thickness and then stacking them together in juxtaposed relationship with respect to each other, such that a first lamination, or layer of material, abuts a second lamination, or layer of material, resulting in a face-to-face, or juxtaposed, stack of laminations that are substantially aligned to define the shape of a Figure 8, or two letter C's in gap-to-gap relation. The two C-shaped, or Figure 8-shaped, core 90 may be arcuate or squared but nonetheless is substantially Figure 8-shaped.

Figure 7F:
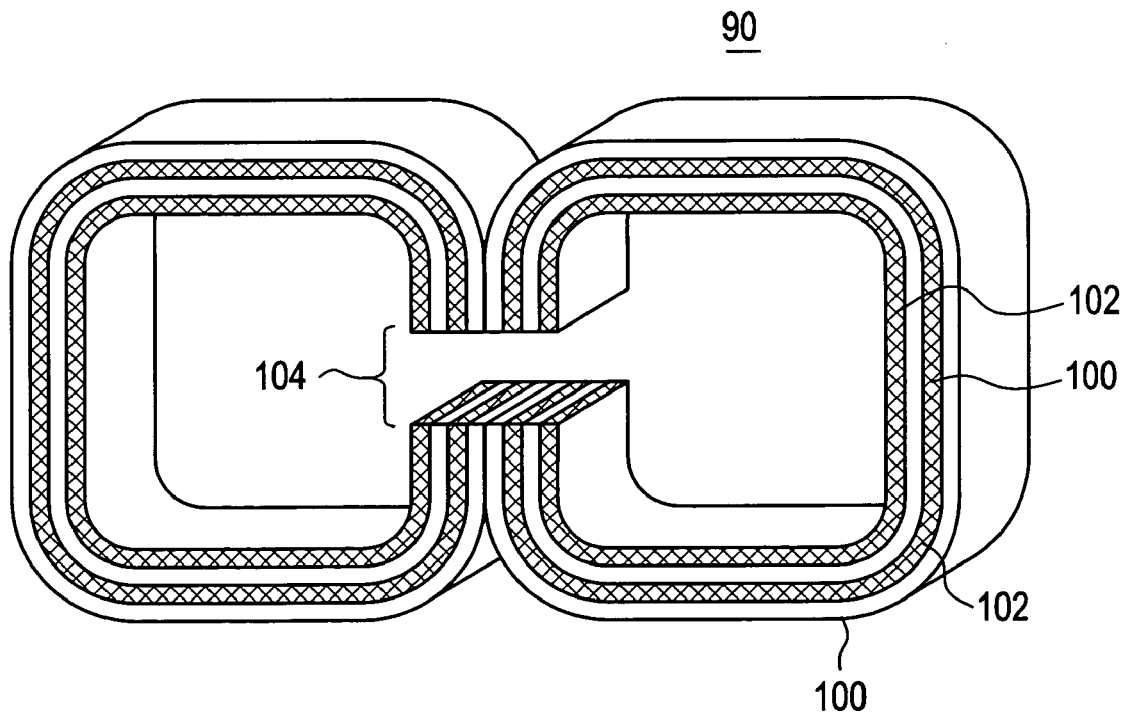

FIG. 7F shows core 90 in a wound-lamination arrangement, where the laminations are created by winding a predefined width of strip or coil material of predefined thickness between predefined start and stop positions in a repetitive manner in order to create a layered arrangement, such that a first lamination, or layer, abuts a second lamination, or layer, resulting in a face-to-face coil of laminations that are substantially aligned to define the shape of a Figure 8, or two letter C's in gap-to-gap relation. A common air gap 104 defines the space between the predefined start and stop positions, gap faces 110 (shown in FIG. 6 for clarity), of the first and second lamination materials of the common central leg 112 of the FIG. 8 arrangement. While only four laminations are shown for each core 90 in FIGS. 7E and F, one skilled in the art will appreciate that the number of laminations is generally a design choice determined by performance and available space and not limited to the count of four.

FIGS. 7E and F show magnetic core 90 having at least two magnetic materials 100 and 102, which are fully described above in reference to FIGS. 7A and B. The aforementioned descriptions for first and second materials 100 and 102 are fully applicable to core 90 of FIGS. 7C and D.

An alternating circuit current in sensor strap 62 generates an associated magnetic flux that is concentrated in magnetic core 90. Secondary windings 92 respond to the magnetic flux in core 90 to produce a signal at output leads 94 that provides operating power to trip unit 18. Magnetic flux sensor 96 located in air gap 104 of core 90 provides an output signal on output voltage leads 108 that is representative of the concentrated magnetic flux in core 90 and the circuit current in sensor strap 62. Leads 106 of magnetic flux sensor 96 connect to a bias voltage source. Magnetic core 90 with mixed magnetic material 100 and 102 results in a magnetic core with a greater dynamic range (linearity and accuracy) than a core not having mixed magnetic material, as shown in FIG. 8 and fully discussed above.

First Alternative Embodiment of Current Sensor Only

Figure 9:
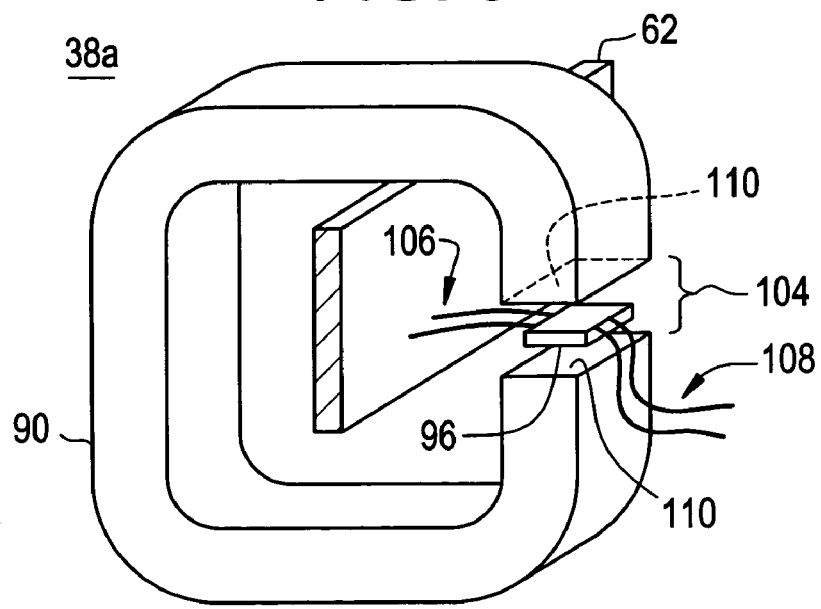
FIG. 9 illustrates an alternative embodiment of a current sensor only incorporating the present invention.

Referring to FIG. 9, a current-sensor-only 38a includes a magnetic core 90 for concentrating the magnetic flux associated with sensor strap 62 (primary winding), and magnetic flux sensor 96 with leads 106, 108 for providing an output signal representative of the circuit current in sensor strap 62. While only a portion of sensor strap 62 is depicted in FIG. 9 for clarity, one skilled in the art will appreciate that the sensor strap 62 in FIG. 9 is representative of the sensor strap 62 in FIG. 3. Alternative constructions of core 90 of FIG. 9 are depicted in FIGS. 7C and D, and have been fully described above in the section entitled "First Alternative Embodiment of Current Sensor and Current Transformer" where reference was made to core 90 of FIGS. 5, 7C and 7D. The aforementioned descriptions of core 90 of FIGS. 5, 7C and 7D are fully applicable to core 90 of FIG. 9.

An alternating circuit current in sensor strap 62 generates an associated magnetic flux that is concentrated in magnetic core 90. Magnetic flux sensor 96 located in air gap 104 of core 90 provides an output signal on output voltage leads 108 that is representative of the concentrated magnetic flux in core 90 and the circuit current in sensor strap 62. Leads 106 of magnetic flux sensor 96 connect to a bias voltage source. Magnetic core 90 with mixed magnetic material 100 and 102 results in a magnetic core with a greater dynamic range (linearity and accuracy) than a core not having mixed magnetic material, as shown in FIG. 8 and fully discussed above.

Second Alternative Embodiment of Current Sensor Only

Figure 10:
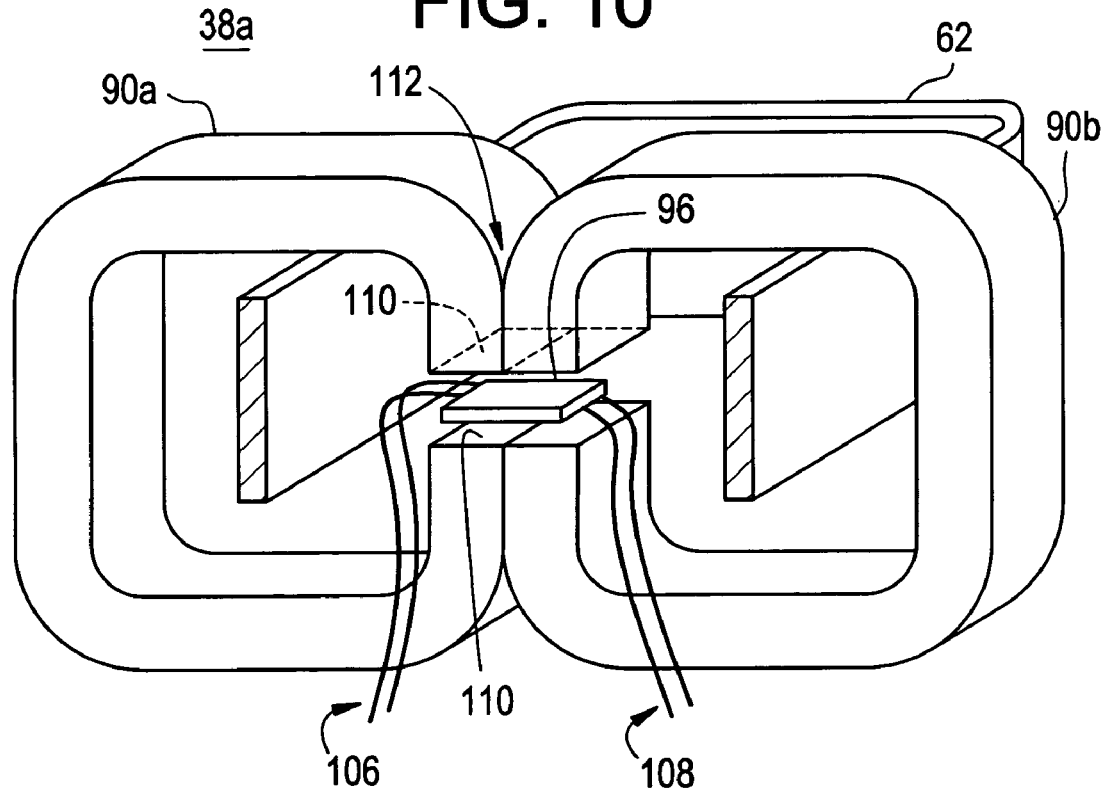
FIG. 10 illustrates another alternative embodiment of a current sensor only incorporating the present invention.

Referring to FIG. 10, current-sensor-only 38a includes a magnetic core 90a,b (hereinafter collectively referred to as magnetic core 90) for concentrating the magnetic flux associated with sensor strap 62 (primary winding), and magnetic flux sensor 96 with leads 106, 108 for providing an output signal representative of the circuit current in sensor strap 62. While only a portion of sensor strap 62 is depicted in FIG. 10 for clarity, one skilled in the art will appreciate that the sensor strap 62 in FIG. 10 is representative of the sensor strap 62 in FIG. 3. Alternative constructions of core 90 of FIG. 10 are depicted in FIGS. 7E and F, and have been fully described above in the section entitled "Second Alternative Embodiment of Current Sensor and Current Transformer" where reference was made to core 90 of FIGS. 6, 7E and 7F. The aforementioned descriptions of core 90 of FIGS. 6, 7E and 7F are fully applicable to core 90 of FIG. 10.

An alternating circuit current in sensor strap 62 generates an associated magnetic flux that is concentrated in magnetic core 90. Magnetic flux sensor 96 located in air gap 104 of core 90 provides an output signal on output voltage leads 108 that is representative of the concentrated magnetic flux in core 90 and the circuit current in sensor strap 62. Leads 106 of magnetic flux sensor 96 connect to a bias voltage source. Magnetic core 90 with mixed magnetic material 100 and 102 results in a magnetic core with a greater dynamic range (linearity and accuracy) than a core not having mixed magnetic material, as shown in FIG. 8 and fully discussed above. While this invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A circuit breaker, comprising:

a housing;

a pair of separable contacts;

a current sensor strap in electrical communication with the contacts;

an operating mechanism for operating the contacts;

an electronic trip unit in operable communication with the strap and the mechanism; and a current transformer comprising:

a mixed material magnetic core having a first layer of material having a relatively high magnetic permeability, and a second layer of material having a relatively low magnetic permeability abutting the first layer of material;

wherein the core has a profile with an opening therethrough for accepting the strap; and a signal generator disposed proximate the core to provide an output signal representative of a magnetic flux associated with the strap;

wherein the mixed material magnetic core exhibits a dynamic range greater than a dynamic range of a similar shaped magnetic core having only one material of the first layer of material and the second layer of material;

wherein a root-mean-square current sensing accuracy of the mixed material magnetic core is equal to or greater than about 99.7% in response to a current in the current sensor strap being at about one times the current rating of the circuit breaker.

2. The circuit breaker of claim 1, wherein:
the profile is substantially O shaped, substantially C shaped, substantially figure-eight shaped, or any combination comprising at least one of the foregoing shapes.

3. The circuit breaker of claim 1, wherein:
the core has a leg and a secondary winding arranged about the leg;
the secondary winding comprises a bobbin having wire turns arranged thereon; and
the secondary winding provides output power.

4. The circuit breaker of claim 1, wherein;
the profile is substantially C shaped;
the core comprises spared opposed gap fares to define an air gap therebetween; and
the signal generator is a magnetic flux sensor disposed within the air gap.

5. The circuit breaker of claim 1, wherein;
the profile is substantially figure-eight shaped;
the core comprises spaced opposed gap faces in the central leg of the figure-eight shape to define an air gap therebetween; and
the signal generator is a magnetic flux sensor disposed within said air gap.

6. The circuit breaker of claim 1, wherein;
the first layer of material is a NiFe alloy having greater than about 50% Ni, a NiFe alloy having about 80% Ni, a Co-based amorphous metallic alloy, a CoFe alloy, a CoFe-V alloy, or any combination comprising at least one of the foregoing alloys; and
the second layer of material is a NiFe alloy having no greater than about 50% Ni, a NiFe alloy having about 50% Ni, an Fe-base amorphous metallic alloy, a SiFe alloy, or any combination comprising at least one of the foregoing alloys.

7. The circuit breaker of claim 1, wherein;
the first layer of material has about 10% more Ni than the second layer of material.

8. The circuit breaker of claim 1, wherein;
the first layer of material has about 20% more Ni than the second layer of material.

9. The circuit breaker of claim 1, wherein;
the first layer of material has about 30% more Ni than the second layer of material.

10. The circuit breaker of claim 1, wherein:
a root-mean-square current sensing accuracy of the mixed material magnetic core is equal to or greater than about 98.7% in response to a current in the current sensor strap being at about 0.2 times the current rating of the circuit breaker.

11. The circuit breaker of claim 1, wherein:
a root-mean-square current sensing accuracy of the mixed material magnetic core is greater than about 94% in response to a current in the current sensor strap being at about nine times the current rating of the circuit breaker.

12. The circuit breaker of claim 1, wherein:
a peak-current sensing accuracy of the mixed material magnetic core is equal to or greater than about 90% in response to a current in the current sensor strap being at about one thousand times the current rating of the circuit breaker.

13. A circuit breaker, comprising:
means for connecting and disconnecting a protected circuit;
a current transformer comprising a mixed material magnetic core having a first layer of material having a relatively high magnetic permeability, and a second layer of material having a relatively low magnetic permeability abutting the first layer of material, the core having a profile with an opening therethrough for accepting a current conductor; and
a signal generator disposed proximate the core to provide an output signal representative of a magnetic flux associated with the current conductor;
wherein the mixed material magnetic core exhibits a dynamic range greater than a dynamic range of a similar shaped magnetic core having only one material of the first layer of material and the second layer of material;
wherein a root-mean-square current sensing accuracy of the mixed material magnetic core is equal to or greater than about 99.7% in response to a current in the current conductor being at about one times to current rating of the circuit breaker.

14. The circuit breaker of claim 13, wherein:
a root-mean-square current sensing accuracy of the mixed material magnetic core is greater than about 94% in response to a current in to current conductor being at about nine times the current rating of the circuit breaker.

15. The circuit breaker of claim 14, wherein:
a peak-current sensing accuracy of the mixed material magnetic core is equal to or greater than about 90% in response to a current in the current conductor being at about one thousand times the current rating of the circuit breaker.

16. The circuit breaker of claim 15, wherein:
a root-mean-square current sensing accuracy of the mixed material magnetic core is equal to or greater than about 98.7% in response to a current in the current conductor being at about 0.2 times the current rating of the circuit breaker.

* * * * *